(12) United States Patent
Chu et al.

(10) Patent No.: US 12,185,483 B2
(45) Date of Patent: Dec. 31, 2024

(54) DISPLAY DEVICE

(71) Applicant: BOE Technology Group Co., Ltd., Beijing (CN)

(72) Inventors: Shangchieh Chu, Beijing (CN); Zongyuan Wang, Beijing (CN); Hong Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 185 days.

(21) Appl. No.: 17/909,444

(22) PCT Filed: Jul. 7, 2021

(86) PCT No.: PCT/CN2021/104998
§ 371 (c)(1),
(2) Date: Sep. 6, 2022

(87) PCT Pub. No.: WO2022/033244
PCT Pub. Date: Feb. 17, 2022

(65) Prior Publication Data
US 2023/0141120 A1    May 11, 2023

(30) Foreign Application Priority Data

Aug. 12, 2020 (CN) .......................... 202021671589.5

(51) Int. Cl.
*H05K 5/00* (2006.01)
*H05K 5/02* (2006.01)
(52) U.S. Cl.
CPC ................................. *H05K 5/0217* (2013.01)

(58) Field of Classification Search
CPC .................................................... H05K 5/0217
(Continued)

(56) References Cited

U.S. PATENT DOCUMENTS 9,135,839 B2   9/2015  Remenda
10,877,523 B2  12/2020 Huang
(Continued)

FOREIGN PATENT DOCUMENTS

CA    2859893 A1    2/2015
CN   104680943 A    6/2015
(Continued)

OTHER PUBLICATIONS

International Search Report and Written Opinion mailed on Sep. 28, 2021, in corresponding PCT/CN2021/104998, 9 pages.

*Primary Examiner* — Zhengfu J Feng
(74) *Attorney, Agent, or Firm* — XSENSUS LLP

(57) ABSTRACT

A display device is provided. The display device includes a housing comprising a fixed part and a movable part, the movable part being movable relative to the fixed part; a first reel rotatably connected to the fixed part; a second reel parallel to the first reel, rotatably connected to the movable part, and provided with a plurality of first protrusions or a plurality of first grooves; and a flexible display panel with a first end fixed to the fixed part, a second end wound around the first reel, and a middle portion wound around the second reel, where the flexible display panel is provided with a plurality of second grooves matching the plurality of first protrusions or with a plurality of second protrusions matching the plurality of first grooves.

10 Claims, 2 Drawing Sheets

(58) Field of Classification Search
USPC .......................................................... 361/807
See application file for complete search history.

(56) References Cited

U.S. PATENT DOCUMENTS

| | | | |
|---|---|---|---|
| 10,963,014 B1* | 3/2021 | Park | H04B 1/3827 |
| 2010/0246113 A1* | 9/2010 | Visser | G09F 9/301 |
| | | | 361/679.3 |
| 2012/0204453 A1* | 8/2012 | Jung | G09F 9/301 |
| | | | 40/517 |
| 2013/0058063 A1* | 3/2013 | O'Brien | G06F 1/1624 |
| | | | 361/807 |
| 2015/0059219 A1 | 3/2015 | Remenda | |
| 2016/0202729 A1* | 7/2016 | Lee | G06F 1/1652 |
| | | | 361/749 |
| 2017/0137933 A1 | 5/2017 | Zhao | |
| 2020/0192434 A1* | 6/2020 | Huang | G06F 1/1681 |
| 2020/0264660 A1* | 8/2020 | Song | G06F 1/1624 |
| 2021/0405703 A1* | 12/2021 | Song | G06F 1/1694 |

FOREIGN PATENT DOCUMENTS

| | | |
|---|---|---|
| CN | 104862650 A | 8/2015 |
| CN | 104680943 B | 7/2017 |
| CN | 107731098 A | 2/2018 |
| CN | 109872639 A | 6/2019 |
| CN | 110599911 A | 12/2019 |
| CN | 210270658 U | 4/2020 |
| CN | 111326070 A | 6/2020 |
| CN | 109872639 B | 4/2021 |
| CN | 212873896 U | 4/2021 |
| WO | 2020/216318 A1 | 10/2020 |

\* cited by examiner

DISPLAY DEVICE

CROSS REFERENCE TO RELATED APPLICATIONS

The present disclosure is a national phase entry under 35 U.S.C. § 371 of International Application No. PCT/CN2021/104998, filed on Jul. 7, 2021 and claims priority of Chinese Patent Application No. 202021671589.5, filed on Aug. 12, 2020, and entitled "DISPLAY DEVICE," the entire disclosures of which are incorporated herein by reference in their entireties.

TECHNICAL FIELD

The present disclosure relates to the field of display technology, and in particular, to a display device.

BACKGROUND

With the vigorous development of science and technology, flexible display panels are gradually realized in mass production and productization. Flexible display panels are gradually entering the vision of consumer, and bendable and rollable display panels have brought a new user experience to consumers while facilitating their lives.

Sliding and rolling is another innovative application area of flexible display panel, which form enables the consumers to switch the display area of flexible panels according to their own needs. It is not only convenient for users to carry around, but also provides users with a better experience than foldable display panels, which is an important direction for the development of flexible display panels. However, in the existing display device, the roller and the flexible display panel are prone to slip, resulting in the roller idle, so that the flexible display panel is easily damaged by uneven local force.

The above information disclosed in the background section is only used to enhance the understanding of the background of the present disclosure, and therefore may include information that does not constitute the prior art known to those of ordinary skill in the art.

SUMMARY

The present disclosure provides a display device.

According to one aspect of the present disclosure, there is provided a display device, including: a housing including a fixed part and a movable part, the movable part being movable relative to the fixed part; a first reel rotatably connected to the fixed part; a second reel parallel to the first reel, rotatably connected to the movable part, and provided with a plurality of first protrusions or a plurality of first grooves; and a flexible display panel with a first end fixed to the fixed part, a second end wound around the first reel, and a middle portion wound around the second reel, where the flexible display panel is provided with a plurality of second grooves matching the plurality of first protrusions or with a plurality of second protrusions matching the plurality of first grooves.

Other features and advantages of the present disclosure will become apparent through the following detailed description, or will be learned in part through the practice of the present disclosure.

It should be understood that both the foregoing general description and the following detailed description are exemplary and explanatory only and not for limiting the present disclosure.

BRIEF DESCRIPTION OF THE DRAWINGS

Accompanying drawings herein, which are incorporated in the specification and constitute a part of the present specification, illustrate embodiments conforming to the present disclosure, and are used to explain the principles of the present disclosure together with the specification. It is apparent that the accompanying drawings described below are only some embodiments of the present disclosure, and other accompanying drawings can also be obtained according to these accompanying drawings without any creative efforts by those skilled in the art.

DETAILED DESCRIPTION

Figure 1:
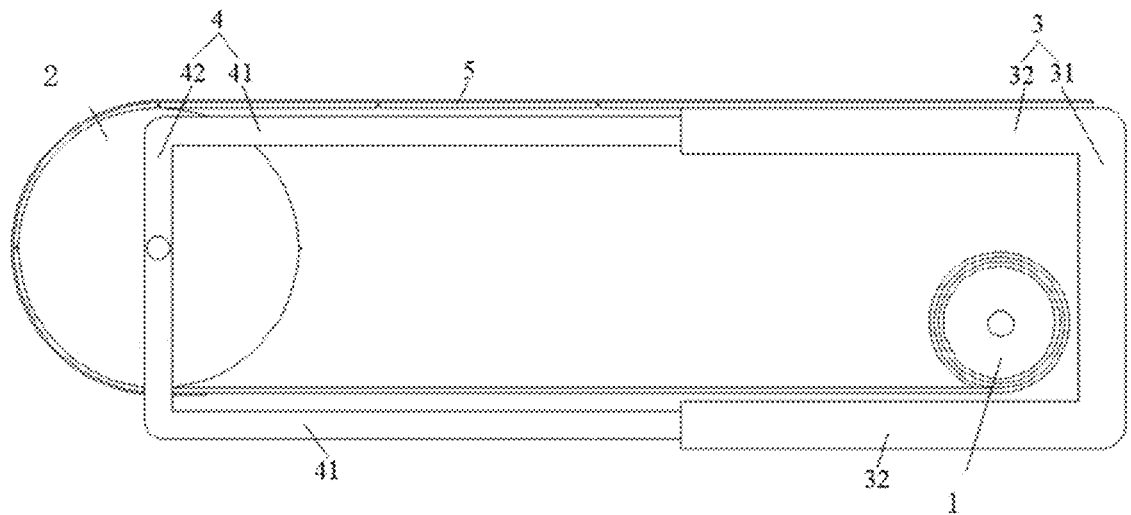
FIG. 1 is a structural schematic diagram of a display device of the present disclosure according to some embodiments.

Embodiments will now be described more fully with reference to the accompanying drawings. However, the embodiments can be implemented in a variety of forms and should not be construed as being limited to the embodiments set forth herein; rather, these embodiments are provided so that the present disclosure will be comprehensive and complete, and the ideas of the embodiments will be fully conveyed to those skilled in the art. The same reference numerals in the drawings indicate the same or similar structures, and thus their detailed description will be omitted.

Figure 2:
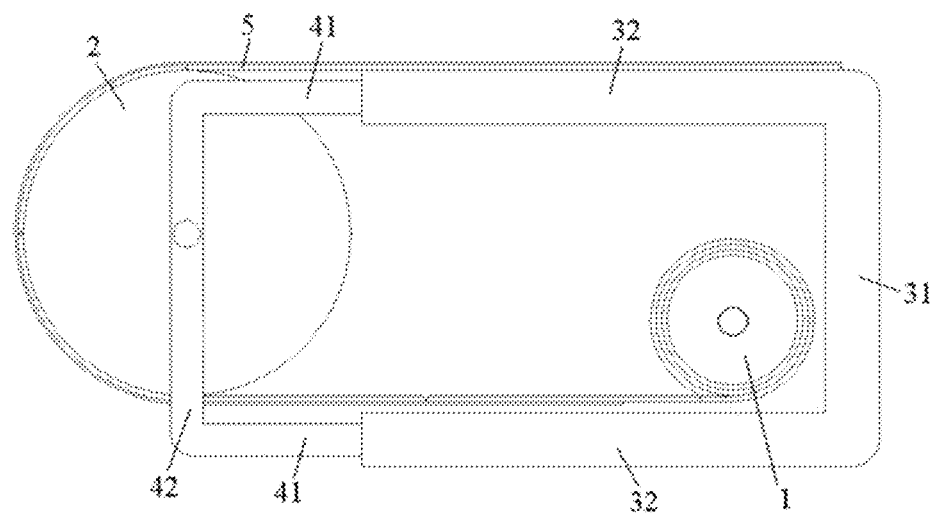
FIG. 2 is a structural schematic diagram of the display device of FIG. 1 after being rolled up.
Figure 3:
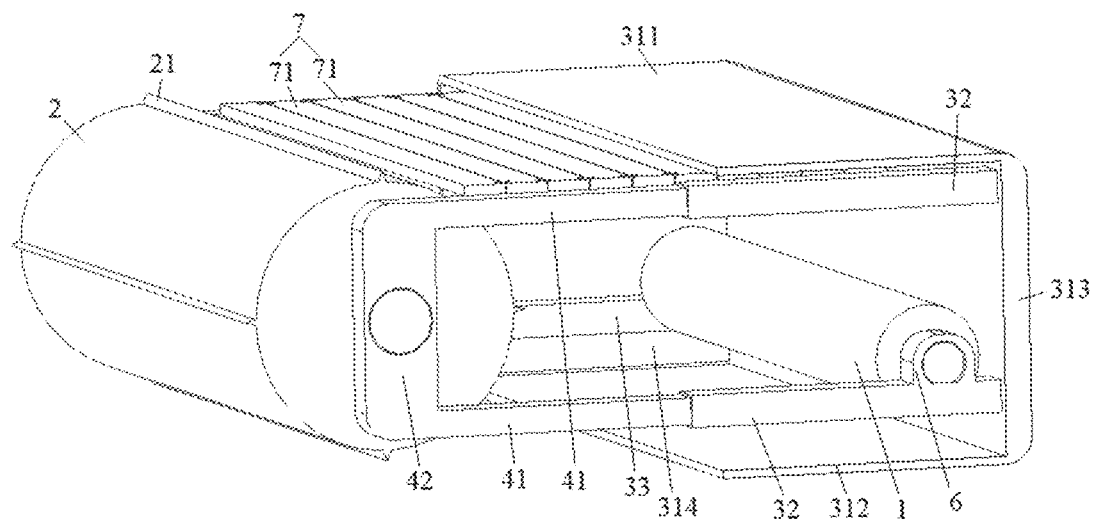
FIG. 3 is a schematic diagram of a three dimensional structure of the display device of FIG. 1 when no flexible display panel is installed.

The present disclosure provides a display device. Referring to the structural schematic diagrams of a display device of the present disclosure according to some embodiments shown in FIG. 1, FIG. 2, and FIG. 3, the display device may include a housing, a first reel 1, a second reel 2, and a flexible display panel 5. The housing includes a fixed part 3 and a movable part 4, where the movable part 4 can move relative to the fixed part 3. The first reel 1 is rotatably connected to the fixed part 3. The second reel 2 is rotatably connected to the movable part 4 and is provided with a plurality of first protrusions 21 or a plurality of first grooves. The second reel 2 is provided parallel to the first reel 1. One end of the flexible display panel 5 is fixed to the fixed part 3, and the opposite other end is wound around the first reel 1, and the middle portion is wound around the second reel 2. The flexible display panel 5 is provided with a plurality of second grooves 54 matching the plurality of first protrusions 21 or the flexible display panel 5 is provided with a plurality of second protrusions matching the first grooves.

In some embodiments, the housing is provided in the shape of a cuboid. The housing may include the fixed part 3 and the movable part 4, the movable part 4 being able to move relative to the fixed part 3.

The fixed part 3 may include a fixed housing 31, two first hollow rods 32 and two second hollow rods 33. The fixed housing 31 is provided in the shape of a cuboid. The fixing housing 31 has an opening. The fixed housing 31 may include a top wall 311, a bottom wall 312, a first side wall 313 and two second side walls 314, the top wall 311, the bottom wall 312, the first side wall 313 and the two second side walls 314 may all be rectangular plates. Since the three side walls are provided, i.e. one first side wall 313 and two second side walls 314, the three side walls are connected to three edges of each of the top wall 311 and the bottom wall 312 correspondingly, such that one of the four edges of each of the top wall 311 and the bottom wall 312 is not connected to form the opening. In some embodiments, the first side wall 313 is connected to edges of the top wall 311 and the bottom wall 312 on a side away from the movable part 4, and the two second side walls 314 are symmetrically connected to the top wall 311, the bottom wall 312 and the first side wall 313. The first side wall 313 is provided parallel to the first reel 1 and the two second side walls 314 are provided perpendicular to the first reel 1.

The two first hollow rods 32 and the two second hollow rods 33 are located correspondingly at the four corners of the fixed housing 31, i.e. at the four corners of the first side wall 313, The two first hollow rods 32 and the two second hollow rods 33 are provided parallel to each other A respective end of the two first hollow rods 32 and the two second hollow rods 33 is fixedly connected to the inner wall surface of the first side wall 313, and a respective other end of the two first hollow rods 32 and the two second hollow rods 33 extends from the fixed housing 31 through the opening. The two first hollow rods 32 are provided symmetrically up and down, and the two second hollow rods 33 are also provided symmetrically up and down. The first hollow rod 32 and the second hollow rod 33 are provided symmetrically at opposite end surfaces of the first reel 1.

In some embodiments, a support plate is connected between the first hollow rod 32 and the second hollow rod 33 close to the top wall 311, and there is a spacing space between the top wall 311, and the first hollow rod 32 and the second hollow rod 33 that are close to the top wall 311, so that there is also a spacing space between the top wall 311 and the support plate.

The movable part 4 may include two movable brackets. The two movable brackets have identical structures and the two movable brackets are provided symmetrically. The two movable brackets are provided at both end surfaces of the second reel 2. The movable bracket may include two movable rods 41 and a connecting plate 42, the two movable rods 41 being provided in parallel, the connecting plate 42 being connected between the two movable rods 41, and the connecting plate 42 being located at an end of the movable rods 41 away from the fixed part 3. The two movable rods 41 are correspondingly inserted into the two first hollow rods 32 at the same end surface of the first reel 1. In the other movable bracket, the two movable rods 41 are correspondingly inserted into the two second hollow rods 33. The movable rods 41 can move along the first hollow rods 32 and the second hollow rods 33, thereby driving the connecting plate 42 to also move along the first hollow rods 32 and the second hollow rods 33 to enable the entire movable part 4 to be move relative to the fixed part 3.

In some embodiments, the first reel 1 is connected between the first hollow rod 32 and the second hollow rod 33 that are close to the bottom wall 312. In some embodiments, mounting shells 6 are provided on the sides, away from the bottom wall 312, of both the first hollow rod 32 and the second hollow rod 33. The mounting shell 6 is provided with a circular via hole, and one end of the first reel 1 is inserted into the circular via hole. A torsional spring is provided inside the mounting shell 6, which is a constant torsional spring (not shown). One end of the constant torsional spring is fixedly connected to the inner side wall of the mounting shell 6, and the other end of the constant torsional spring is fixedly connected to the first reel 1. The constant torsional spring can provide a constant torsional force to the first reel 1. The constant torsional spring can provide a rotary force to the first reel 1 so that the first reel 1 can be rotated relative to the fixed part 3.

Further, the structures of the fixed part 3 and the movable part 4 are not limited to the above description, for example, the fixed part 3 may include a side wall on which four rails may be provided vertically. The movable part 4 may be provided with sliders on the movable rod 41 that cooperate with the rails. It is also possible to provide the first hollow rods 32 and the second hollow rods 33 of the fixed part as solid rods, and the movable rods 41 of the movable part 4 as hollow rods, where the solid rods of the fixed part are inserted into the hollow rods of the movable part 4.

A locking mechanism may also be provided between the fixed part 3 and the movable part 4 which can lock the fixed part 3 and the movable part 4 to avoid movement of the movable part 4. The locking mechanism may include a plurality of via holes provided on the first hollow rod 32 or the second hollow rod 33 and arranged along the length of the first hollow rod 32 or the second hollow rod 33, and a spring provided on the movable rod 41 and a clamping column connected to the spring, the central axis of the spring being perpendicular to the central axis of the movable rod 41. When the movable rod 41 needs to be able to move, a larger pull or push force can be applied to cause the clamping column to be squeezed and moved down, so that the movable rod 41 can be moved and switched to different clamping point positions. When the movable rod 41 needs to be unable to move, the clamping column can be made to be stuck in the via hole.

In some embodiments, the second reel 2 is connected between the two connecting plates 42 of the two movable brackets. In some embodiments, two end portions of the second reel 2 are connected to the two connecting plates 42 at central positions of the two connecting plates 42 by bearings, allowing the second reel 2 to rotate relative to the movable brackets.

Figure 5:
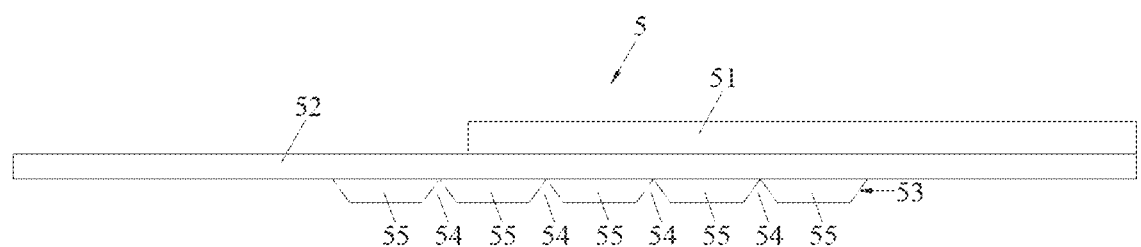
FIG. 5 is a structural schematic diagram of a support film group in FIG. 1.

In this example embodiment, referring to FIG. 5, the flexible display panel 5 may include a flexible screen 51 and a support film group. The support film group is provided on a side of the flexible screen 51 opposite to the display surface, and second grooves 54 are provided on a side of the support film group away from the flexible screen 51. The second grooves 54 are provided along an axial direction of the first reel 1, i.e. the length direction of the second grooves 54 is consistent with the axial direction of the first reel 1.

In some embodiments, the support film group may include a first support film 52 and a second support film 53, the first support film 52 is provided on the side of the flexible screen 51 opposite to the display surface, and the second support film 53 is provided on a side of the first support film 52 away from the flexible screen 51. The material of the first support film 52 may be metal or plastic, and the material of the second support film 53 may be silicone, or rubber. The thickness of the first support film 52 ranges from approximately 50 μm to 200 μm, and the thickness of the second support film 53 ranges from approximately 0.3 mm to 2 mm. The second support film 53 may include a plurality of film strips 55 which have a length direction consistent with the axial direction of the second reel 2. A V-shaped second groove 54 is formed between two adjacent film strips 55, i.e., the cross-sectional shape of the film strip 55 perpendicular to the axial direction of the second reel 2 can be an isosceles trapezoid, the long bottom edge of the isosceles trapezoid is connected to the first support film 52, and the short bottom edge of the isosceles trapezoid is located on the side away from the first support film 52. The side walls of the two adjacent film strips 55 form the groove walls of the second groove 54. Of course, in other embodiments of the present disclosure, the cross-sectional shape of the second groove 54 perpendicular to the axial direction of the second reel 2 may be an isosceles trapezoid, U-shaped, and other shapes in which the opening is larger than the bottom, so as to facilitate the embedding of the first protrusion 21 into the second groove 54. It is possible to provide a second protrusion instead of a second groove 54 on the film strip 55, and the second protrusion is provided along the axial direction of the first reel 1, i.e. the length direction of the second protrusion is consistent with the axial direction of the first reel 1.

In some other embodiments of the present disclosure, the support film group may include only the first support film 52, i.e., the second support film 53 may not be provided. The material of the first support film 52 may be metal or plastic. The second groove 54 or the second protrusion may be provided on the side of the first support film 52 away from the flexible screen 51. The cross section of the second groove 54 perpendicular to the axial direction of the second reel 2 can also be in the V-shape, U-shape, isosceles trapezoid shape, etc., in which the opening is larger than the bottom.

It should be noted that the second grooves 54 may extend through the entire support film group or may occupy only a portion of the support film group in length, i.e., the length of the second grooves 54 is equal to or less than the length of the support film group. A plurality of second grooves 54 may be provided side by side, or may be staggered.

Figure 4:
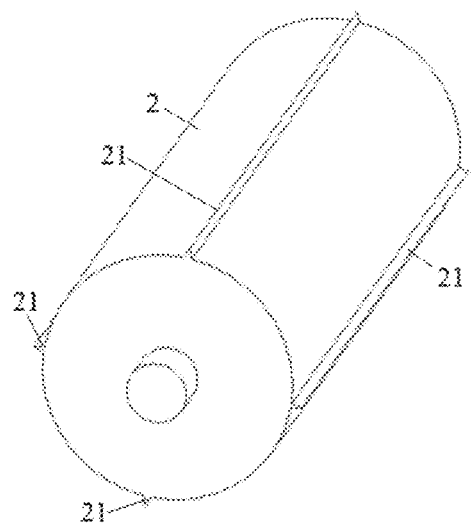
FIG. 4 is a structural schematic diagram of a second reel in FIG. 1.

In some embodiments, referring to FIG. 4, the first protrusion 21 is provided on the second reel 2 which extends along the axial direction of the second reel 2, i.e. the length direction of the first protrusion 21 is consistent with the axial direction of the second reel 2. The cross-sectional shape of the first protrusion 21 perpendicular to the axial direction of the second reel 2 may also be V-shaped. The height of the first protrusion 21 may be less than or equal to the depth of the second groove 54, the width of the first protrusion 21 may be less than or equal to the width of the second groove 54, and the length of the first protrusion 21 is less than or equal to the length of the second groove 54, so that the first protrusion 21 can match with the second groove 54, i.e., the first protrusion 21 can be embedded in the second groove 54. Of course, in other embodiments of the present disclosure, the cross-sectional shape of the first protrusion 21 perpendicular to the axial direction of the second reel 2 may be an isosceles trapezoid, a U-shape, and the like, which is adapted to the second groove 54.

In the case where the second grooves 54 extend through the entire support film group, the first protrusions 21 may also extend through the entire second reel 2, or the first protrusions 21 may occupy only a portion of the second reel 2 in length. The plurality of first protrusions 21 may be provided side by side or staggered as long as they are adapted to the second grooves 541 so that the distance between two adjacent second grooves 54 is the same as the distance between two adjacent first protrusions 21.

In addition, the shapes of the first protrusion 21, the first groove, the second protrusion and the second groove 54 are not limited to the above description, for example, a cross section of the first protrusion 21 or the first groove parallel to an axial direction of the second reel is shaped as a rectangular, an ellipse, a circular, a parallelogram, and the like; and a cross section of the second protrusion or the second groove 54 parallel to the axial direction of the second reel is shaped correspondingly as a rectangular, an ellipse, a circular, and a parallelogram, and the like.

In some embodiments, further referring to FIG. 5, the first support film 52 has a first end and a second end opposite to each other. The second support film 53 also has a first end and a second end opposite to each other. The first end and the second end of the first support film 52 correspondingly extend beyond the first end and the second end of the second support film 53, i.e., the length of the first support film 52 is greater than the length of the second support film 53, and the second support film 53 is located at the middle position of the first support film 52. The first end of the first support film 52 is fixed to the upper surface of the fixed housing 31 of the fixed pail 3, and the second end of the first support film 52 is wound around the first reel 1, i.e. the second support film 53 is not connected to the fixed housing 31 of the fixed part 3, and the second support film 53 is not wound around the first reel 1. The main function of the second support film 53 is to match with the second reel 2, so as to avoid the second reel 2 from slipping and idling when the display device is unfolded and causing damage to the flexible display panel 5 due to uneven local force. Therefore, the short length of the second support film 53 can save material and human resources.

In some embodiments, the flexible screen 51 also has a first end and a second end opposite to each other. The length of the flexible screen 51 is also smaller than the length of the first support film 52, and the first end of the flexible screen 51 is aligned with the first end of the first support film 52, and the second end of the first support film 52 extends beyond the second end of the flexible screen 51. In this way, the first end of the flexible screen 51 is fixed to the upper surface of the fixed housing 31 of the fixed part 3 by the first support film 52, the second end of the flexible screen 51 is not wound around the first reel 1, and the flexible screen 51 is only wound around the second reel 2. Since the display device inevitably has a pail of the flexible display panel 5 needs to be wound around the first reel 1 when in use, and the flexible screen 51 cannot be displayed when wound around the first reel 1, i.e., the part is an invalid part, so that the length of the flexible screen 51 can be made shorter to avoid the length of the invalid part, thus saving materials and human resources and reducing costs.

In some embodiments, the display device may further include an auxiliary support member 7, one end of which may be connected to the movable part and close to the second reel 2, and the opposite other end of which may be attached to the fixed part and located on a side of the flexible display panel away from the display surface to support the flexible display panel. The auxiliary support member 7 may include a plurality of support strips 71, and the side of the plurality of support strips 71 away from the flexible display panel may be connected by a tape. The support strips 71 extends along the axial direction of the second reel 2, i.e. the plurality of support strips 71 are provided parallel to each other, and the length direction of the support strips 71 is consistent with the axial direction of the second reel 2. One end of the auxiliary support member 7 is connected to the movable rod 4, and the opposite other end of the auxiliary support member 7 is inserted into the spacing space between the top wall 311 and the support plate. The movable rod 4 will pull out the auxiliary support member 7 when the display device is unfolded, and the auxiliary support member 7 provides support for the flexible display panel 5. When the display device is rolled up, the auxiliary support member 7 will be inserted into the spacing space between the top wall 311 and the support plate. In other example embodiments of the present disclosure, one end of the auxiliary support member 7 may be connected to the second reel 2, and a portion of the auxiliary support member 7 will be wrapped around the second reel 2 when the display device is unfolded. Of course, the auxiliary support member 7 can also be provided as a rigid support plate.

When using this display device, the user pulls the fixed part 3 and the movable part 4 in opposite directions, and the movable rods 41 of the movable part 4 are pulled out from the first hollow rods 32 and the second hollow rods 33 of the fixed part 3, and the flexible display panel 5 and the auxiliary support 7 are also pulled out. In this process, the flexible display panel 5 drives the first reel 1 and the second reel 2 to rotate clockwise, so that the flexible display panel 5 can be smoothly unfolded. The first reel 1 will drive the two constant torsional springs to rotate, so that the constant torsional springs have a constant torsional force. When the flexible display panel 5 is unfolded to a preset position for rolling, the user releases the movable part 4, and under the action of the torsional force of the constant torsional springs, the first reel 1 rotates counterclockwise to wind the second support film 53 of the flexible display panel 5 on the first reel 1, and at the same time, the flexible display panel 5 will drive the first reel 1 to rotate counterclockwise until the rolling is completed. When this display device is unrolled or rolled up, due to the cooperation of the second groove 54 or the second protrusion on the flexible display panel 5 and the first protrusion 21 or the first grooves on the second reel 2, the flexible display panel 5 can drive the second reel 2 to rotate, avoiding the damage caused by the uneven local force on the flexible display panel 5 caused by the idling of the second reel 2.

The features, structures or characteristics described above may be combined in any appropriate manner in one or more embodiments, and the features discussed in the various embodiments are interchangeable if possible. In the above description, many specific details are provided thereby giving a full understanding of the embodiments of the present disclosure. However, those skilled in the art will realize that it is possible to practice the technical embodiments of the present disclosure without one or more of the particular details described, or that other methods, components, materials, etc. may be employed. In other instances, well-known structures, materials, or operations are not shown or described in detail to avoid obscuring aspects of the present disclosure.

The terms "about", "approximately" used in this specification generally indicate that it is within 20%, preferably within 10%, and more preferably within 5% of a given value or range. The quantities given herein are approximate quantities, meaning that "about," "approximately," "roughly," "probably" ray still be implied in the absence of specific instructions.

Although relative terms such as "up" and "down" are used in this specification to describe the relative relationship of one component of the icon to another, these terms are used in this specification only for convenience, such as in accordance with the orientation of the examples illustrated in the accompanying drawings. It should be understood that if the device of the icon is flipped so that it is upside down, the component described as being "up" will become the component described as being "down". Other relative terms such as "high", "low", "top", "bottom", etc. are used with similar meaning. When a structure is "on" another structure, it may mean that a structure is integrally formed on another structure, or that a structure is "directly" arranged on another structure, or that a structure is "indirectly" arranged on other structures through another structure.

In this specification, the terms "one", "a/an", "the" and "said" are used to indicate the existence of one or more elements/components/etc. The terms "contains", "includes" and "comprises" are used to indicate an open-ended inclusion and to mean that additional elements/components/etc. may exist in addition to those listed elements/components/etc. The terms "first", "second" and "third" are used as indications only and are not intended to limit the number of objects.

It should be understood that the present disclosure does not limit its application to the detailed construction and arrangement of the components presented herein. The present disclosure can have other embodiments, and can be implemented and performed in a variety of ways. The foregoing variations and modifications fall within the scope of the present disclosure. It is to be understood that the present disclosure as disclosed and limited by this specification extends to all alternative combinations of two or more individual features mentioned or evident in the text and/or the accompanying drawings. All such different combinations constitute multiple alternative aspects of the present disclosure. The embodiments described herein illustrate the best manner known for implementing the present disclosure and will enable those skilled in the art to utilize the present disclosure.

What is claimed is:

1. A display device, comprising:
   a housing comprising a fixed part and a movable part, the movable part being movable relative to the fixed part;
   a first reel rotatably connected to the fixed part;
   a second reel parallel to the first reel, rotatably connected to the movable part, and provided with a plurality of first protrusions or a plurality of first grooves; and
   a flexible display panel with a first end fixed to the fixed part, a second end wound around the first reel, and a middle portion wound around the second reel, wherein the flexible display panel is provided with a plurality of second grooves matching the plurality of first protrusions or with a plurality of second protrusions matching the plurality of first grooves;
   wherein the flexible display panel comprises:
   a flexible screen; and
   a support film group on a side of the flexible screen opposite to a display surface, the plurality of second protrusions or the plurality of second grooves being on a side, away from the flexible screen, of the support film group, wherein the support film group comprises:
     a first support film on the side of the flexible screen opposite to the display surface, wherein the first support film has a first end and a second end opposite to each other, the first end being fixed to the fixed part and the second end being wound around the first reel; and
     a second support film on a side, away from the flexible screen, of the first support film, wherein the second support film has a first end and a second end opposite to each other, the first end of the first support film extending beyond the first end of the second support film, the second end of the first support film extending beyond the second end of the second support film; and the second support film comprises a plurality of film strips that have a length direction consistent with an axial direction of the second reel, wherein the plurality of second grooves are between two adjacent film strips of the plurality of film strips and have a length direction consistent with the axial direction of the second reel.

2. The display device of claim 1, wherein the plurality of second grooves have V-shaped cross sections perpendicular to the axial direction of the second reel, and the plurality of first protrusions have V-shaped cross sections perpendicular to the axial direction of the second reel and a length direction consistent with the axial direction of the second reel.

3. The display device of claim 2, wherein the first protrusions have a height less than or equal to a depth of the second groove, a width less than or equal to a width of the second groove, and a length less than or equal to a length of the second groove.

4. The display device of claim 1, wherein the flexible screen has a first end and a second end opposite to each other, the first end of the flexible screen being aligned with the first end of the first support film, and the second end of the first support film extending beyond the second end of the flexible screen.

5. The display device of claim 1, wherein a material of the first support film is plastic or metal and a material of the second support film is silicone.

6. The display device of claim 1, further comprising:
two torsional springs each of which is connected between an end of the first reel and the fixed part.

7. The display device of claim 1, wherein a cross section of the plurality of first protrusions or the plurality of first grooves parallel to the axial direction of the second reel is shaped as one of: a rectangular, an ellipse, a circular, and a parallelogram; and a cross section of the plurality of second protrusions or the plurality of second grooves parallel to the axial direction of the second reel is shaped correspondingly as one of: a rectangular, an ellipse, a circular, and a parallelogram.

8. The display device of claim 1, further comprising:
an auxiliary support member on a side, away from a display surface, of the flexible display panel to support the flexible display panel, one end of which is connected to the movable part, and an opposite other end of which is attached to the fixed part.

9. The display device of claim 8, wherein the auxiliary support member comprises a plurality of support strips that have a length direction consistent with the axial direction of the second reel.

10. The display device of claim 1, wherein the fixed part comprises:
a fixed housing with an opening;
two first hollow rods parallel to each other, each of which has one end fixed in the fixed housing and an opposite other end extending out of the fixed housing through the opening; and
two second hollow rods parallel to each other and parallel to the two first hollow rods, each of which has one end fixed in the fixed housing and an opposite other end extending out of the fixed housing through the opening; and
wherein the movable part comprises two movable brackets, each of which comprises:
two movable rods parallel to each other; and
a connecting plate connected between the two movable rods; and
wherein the two movable rods of one of the movable brackets are inserted correspondingly into the two first hollow rods, and the two movable rods of the other movable bracket are inserted correspondingly into the two second hollow rods.

\* \* \* \* \*